United States Patent [19]

Van Rees et al.

[11] Patent Number: 4,689,094
[45] Date of Patent: Aug. 25, 1987

[54] COMPENSATION DOPING OF GROUP III-V MATERIALS

[75] Inventors: H. Barteld Van Rees, Newton Upper Falls; Paul E. Whittier, Jr., Northborough, both of Mass.

[73] Assignee: Raytheon Company, Lexington, Mass.

[21] Appl. No.: 813,305

[22] Filed: Dec. 24, 1985

[51] Int. Cl.$^4$ .................. C03B 23/00; H01L 21/205; H01L 21/365
[52] U.S. Cl. ............................ 437/104; 156/610; 156/613; 156/614; 357/13; 357/15; 357/64; 357/89
[58] Field of Search .............. 29/576 E; 148/174, 175, 148/DIG. 41, 56, 65, 110; 156/610, 613, 614; 252/950, 951; 427/87, 248; 357/13, 15, 64, 89, 90

[56] References Cited

U.S. PATENT DOCUMENTS

| | | | |
|---|---|---|---|
| 3,312,570 | 4/1967 | Ruehrwein | 148/175 |
| 3,462,323 | 8/1969 | Groves et al. | 148/175 |
| 3,856,585 | 12/1974 | Moon et al. | 148/175 |
| 3,901,746 | 8/1975 | Boucher | 148/175 |
| 3,925,118 | 12/1975 | Hollan | 148/175 |
| 4,062,706 | 12/1977 | Ruehrwein | 148/175 |
| 4,086,109 | 4/1978 | Hallais | 148/175 |
| 4,204,893 | 5/1980 | Cox | 148/175 |
| 4,279,670 | 7/1981 | Steele | 148/175 |
| 4,504,331 | 3/1985 | Kuech et al. | 148/175 |

OTHER PUBLICATIONS

Sorab K. Ghandhi, "VLSI Fabrication Principles", John Wiley & Sons, New York, N.Y., 1983, pp. 26–30.
R. R. Fergusson and T. Gabor, "The Transport of Gallium Arsenide in the Vapor Phase by Chemical Reaction", J. Electrochem. Soc., vol. 111, No. 5, May 1964, pp. 585–592.

Primary Examiner—Brian E. Hearn
Assistant Examiner—William Bunch
Attorney, Agent, or Firm—Denis G. Maloney; Richard M. Sharkansky

[57] ABSTRACT

A method of growing an epitaxial doped chromium buffer layer is described. A first flow of arsenic trichloride and hydrogen is directed through a retort having disposed therein at an elevated temperature chromium and gallium arsenide crystals. The arsenic trichloride reacts with the chromium and the gallium arsenic crystals to produce chromium chloride, gallium chloride and arsenic. This vapor stream is then directed into a reactor tube where a second flow of gallium chloride and arsenic is provided. Deposited from these flows is gallium arsenide doped with chromium.

12 Claims, 6 Drawing Figures

COMPENSATION DOPING OF GROUP III-V MATERIALS

BACKGROUND OF THE INVENTION

This invention relates generally to semiconductor devices and manufacturing methods and, more particularly, to compensation doping of semiconductor materials formed by vapor phase epitaxy.

As is known in the art, semiconductor devices such as field effect transistors and monolithic microwave integrated circuits are often employed to amplify or process radio frequency signals. For example, a field effect transistor is often employed to convert D.C. power to radio frequency power by feeding an R.F. voltage signal to a gate electrode of the field effect transistor to thereby control conductivity of an underlying drain-source channel of the field effect transistor. Radio frequency performance is dependent upon the quality of the crystalline structure of the semiconductor layers used to form the field effect transistor. As is also known in the art, Group III-V semiconductor material systems such as the system employing gallium arsenide (GaAs) are often used to fabricate field effect transistors for amplifying or for converting D.C. power to radio frequency power.

One technique used in the prior art to provide semiconductor layers for field effect transistors is to grow such layers directly over a substrate comprising the Group III-V material, for example, gallium arsenide. The substrate generally is prepared with a relatively high bulk resistivity, typically in the range of $10^7$–$10^8$ ohms-cm. This relatively high resistivity is required to provide the field effect transistors with relatively low leakage currents. The leakage current of the field effect transistor affects the field effect transistor's R.F. performance since the leakage current cannot readily be controlled or modulated by the R.F. voltage signal applied to the gate electrode.

Generally, two methods are employed in the prior art to prepare substrates of gallium arsenide having a relatively high bulk resistivity. One method is the so-called "Horizontal Bridgeman Technique" which involves the steps of introducing elemental gallium and arsenic into a quartz reaction vessel disposed in a furnace at an elevated temperature, reacting the gallium and arsenic to form a gallium arsenide melt, and slowly withdrawing the sealed vessel from the furnace to form a bar of the material having a crystalline structure. The bar is sliced into substrates which are then lapped and polished. The resistivity of these substrates is generally lowered because residual donor ions originating from the quartz reaction vessel are present in the crystal structure. Accordingly, this method generally requires doping with a compensating acceptor material such as chromium. With a second method, the so-called "Czochralski Technique", a seed crystal is slowly withdrawn from a gallium arsenide melt in a controlled atmosphere. This technique is particularly useful in providing relatively large circular substrates of gallium arsenide. Several variations of this technique have been developed including the more widely used Liquid Encapsulated Czochralski Technique where a seed crystal is pulled through a layer of melted boron oxide which acts as an encapsulant to assist in prevention of arsenic from leaving the melt, a problem generally common to the Czochralski technique.

A problem common to both techniques, particularly the Czochralski, is that extra or interstitial arsenic atoms result in stoichiometric defects generally denoted in the art as "EL2". As shown in FIG. 1, these defects may become ionized in the presence of an electron current flux and produce an ionized center (fixed positive charge) and a free electron in the conduction band. These ionized sites and free electrons are partially compensated to maintain semi-insulating characteristics by chromium doping described above or by the presence of chemical contaminants in the gallium arsenide melts which act as electron acceptors. Chromium as well as these contaminants in the presence of an electron current flux act as electrically active impurities by accepting an electron from the valance band which creates a hole current in the valance band and also an ionized center (fixed negative charge). The balance of fixed charges and currents provides the high resistivity characteristics.

However, the crystalline quality of the substrates fabricated by either method is generally not suitable for fabrication of high performance field effect transistors directly thereover because inside of the crystal structure close to the surface of the substrate, unwanted crystalline defects such as hole and electron traps are present which can degrade the electrical properties of the device. These traps can become ionized sites either accepting or emitting an electron. During operation of a field effect transistor, the electric field created by ionization of these traps restricts the flow of electrons in the channel with a concomitant loss in power, an effect generally known in the art as "backgating".

One solution known in the art is to provide a buffer layer comprising an epitaxially grown crystalline layer over the substrate between active regions of the semiconductor device and the substrate. The buffer layer should provide a layer having a high crystalline quality, and high resistivity to shield the active regions of the field effect transistor from crystalline defects in the substrate.

One method suggested in the art is to grow a buffer layer using chromium as a compensating dopant. Chromium or a similar "deep level" acceptor accepts electrons having an energy level intermediate the crystal's valence band level and the crystal's conduction band providing an ionized site or fixed negative charge and a hole current in the valence band of the crystal. As previously mentioned, contaminants such as Si provided by the growth apparatus are electron donors. When ionized, atoms such as Si provide an electron current flow in the conduction band of the crystal and an ionized site or fixed positive charge. It is an object, therefore, when compensating with chromium to provide a hole current flow in the valence band of the crystal and hence a fixed negative charge to compensate for the electron flow in the conduction band of the crystal and fixed positive charge.

Several methods have been suggested in the art for growing buffer layers doped with a deep level acceptor such as chromium. In one of these methods, vapors, for example, from either $CrO_2Cl_2$, $Cr(CO)_6$ or $Cr_2O_3$ sources are decomposed to provide chromium. More particularly, these vapors are directed into a reactor tube apparatus where they react to provide elemental chromium which is incorporated in the crystal structure of the gallium arsenide buffer layer. One problem with this technique is that the reactions, for example the $CrO_2Cl_2$ reaction, are highly endothermic. Accordingly, large deposits of chromium are generally left on the walls of the reactor tube. Because of the presence of Cr on the walls of the reactor, it is therefore difficult to control the concentration of chromium in the buffer layers. Furthermore, since the chromium remains in the reactor tube, it is generally very difficult to automatically start growing the active regions of the semiconductor without having the chromium dopant present in high concentrations in the active regions. Doping of the active regions with chromium is highly undesirable, since chromium being a deep level acceptor will become ionized in response to an electron current flux. This will result in a fixed negative charge in the active layer which will repel electrons in the active layer thereby constricting the channel and hence reducing current density and device performance.

A second method used for chromium doping involves etching a source of elemental chromium. In a typical vapor phase epitaxial apparatus, the quartz reactor tube is disposed in a furnace and has mounted therein a substrate upon which is grown the epitaxial layer. The quartz reactor tube has a first end which is fed via a pair of lines, a first line generally denoted as "the growth line" and a second line downstream from the growth line generally denoted as "the etching line." The growth line and etching line are each fed from a reactant source of, for example, arsenic trichloride. The arsenic trichloride is provided, via a growth bubbler, in a vapor stream comprised of hydrogen. From the growth line, arsenic trichloride vapors are directed over a source of the material to be grown, in this case gallium arsenide. The arsenic trichloride reacts with the gallium arsenide source providing a vapor stream comprising gallium chloride and arsenic. From the etching line, arsenic trichloride vapors are directed over the source of chromium which is disposed in the same reactor tube and same temperature zone of the tube and separated from the gallium arsenide source. This arsenic trichloride vapor also reacts with the chromium to provide chromium chloride as the dopant precursor. While the chromium doping of an epitaxial layer is possible using this technique, there are nevertheless several problems with this technique. With this method as mentioned, two vapor flows are directed towards the substrate. The first flow is the growth flow comprised of the gallium chloride and arsenic and the second flow is the flow of the dopant as chromium chloride ($CrCl_2$). The chromium chloride is provided by the reactions over the Cr source as:

$$2\,AsCl_3 + 3H_2 \rightarrow \tfrac{1}{2}As_4 + 6HCl \tag{1}$$

$$Cr + 2HCl \rightarrow CrCl_2 + H_2 \tag{2A}$$

whereas the gallium arsenide precursor components in the vapor stream are provided by the reaction over the GaAs solid source as:

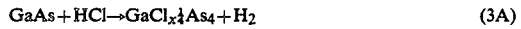
$$GaAs + HCl \rightarrow GaCl_x + \tfrac{1}{4}As_4 + H_2 \tag{3A}$$

where x is generally 1, 2, 3 and/or 4. In the growth region over the substrate where the temperature of the tube is lower, these reactions reverse direction (due to lower temperature over the substrate) to provide the doped epitaxial material in accordance with the following reactions:

$$CrCl_2 + H_2 \rightarrow Cr + 2HCl \tag{2B}$$

$$GaCl_x + \tfrac{1}{4}As_4 + H_2 \rightarrow GaAs + 2HCl \tag{3B}$$

However, at the substrate because of the decomposition of $CrCl_2 + H_2$ into Cr and HCl, the concentration of HCl ([HCl]) in the composite vapor stream is higher in comparison to the [HCl] without Cr doping. Since the [HCl] is increased, reaction (3B) will not proceed as efficiently and will have a tendency to reverse direction and proceed as reaction (3A) even at the lower reaction temperature. That is, the reaction will tend to produce $GaCl_x$ and $As_4$ by etching of the GaAs substrate due to the excess [HCl]. In other words, the rate at which GaAs is deposited out of the stream and onto the substrate will be reduced and, further, if the increase in [HCl] is large enough, the reaction could become a net etching reaction in which GaAs is removed from the substrate.

Thus, the extra HCl flow in the vapor flow over the substrate slows the growth rate reaction because the increase in [HCl] shifts the reaction equilibrium of reaction [3B] towards the right to establish a new equilibrium. This reduced growth rate causes two problems. The first problem is that the time required to grow the epitaxial layers increases resulting in a concomitant increase in cost. Secondly, since the growth rate is relatively slow, impurities present in the substrate have a longer period of time over which to out-diffuse from the substrate into the buffer layer. This is particularly true with so-called "fast diffusing impurities" such as iron and copper. Diffusion of these impurities into a compensated buffer layer provides a concomitant reduction in the resistivity of the buffer layer and is therefore undesirable. One of the objectives in growing a chromium doped buffer layer is to grow the buffer layer sufficiently fast with the dopant so that the so-called "fast diffusion impurities" like iron and copper do not have a sufficient amount of time to out-diffuse from the substrate. By providing the increased concentration of hydrogen chloride in the vapor stream, slowing or even halting of the growth of GaAs results. This provides additional time for the impurities from the substrate to diffuse into the buffer layer.

A problem with using chromium as a compensating dopant is that chromium being a so-called "deep level acceptor", that is, having an electron energy level intermediate the crystal conduction and valence bands as shown in FIG. 1, may provide in response to a large, high frequency changing electron current flux, a fixed negative charge layer which may repel electrons in the active layer of the field effect transistor, particularly, power field effect transistors. This fixed charge results from the rate of recombination of electrons and holes between the valence band and the "deep level acceptor" chromium being lower than the rate of change of the injected electron current flux in the conduction band. This problem with chromium is particularly important or evident where the chromium concentration is not readily controlled.

Further, it is also believed that with the current techniques Cr has a tendency to out-diffuse from the buffer layer into active layers of the field effect transistor when the concentration of Cr is not readily controlled. This diffusion is particularly undesirable because it results in a decrease in electron mobility which affects current density and device performance as mentioned previously. Further, the fixed negative charge layer may also occur further degrading device performance as described above.

A further problem common to most techniques is the difficulty in growing a buffer layer having a uniform concentration of chromium over the entire substrate surface.

Accordingly, although chromium doping is known as a compensation technique for increasing the resistivity of buffer layers, there are inherent problems associated with the known techniques which limits the usefulness of chromium doping for epitaxial buffer layers. With either technique, it is generally difficult to control the concentration of chromium during doping of the buffer layer and, in particular, it is difficult to stop doping of the chromium when changing from buffer layer growth to active layer growth. This may result in out-diffusion of Cr from the buffer layer or doping of active layers with Cr through incorporation of residual Cr in the reactor tube. Accordingly, a fixed net charge layer may be provided adjacent the active layer during operation of the field effect transistor. Further, with the etching technique of a solid elemental Cr source, the growth rate of the gallium arsenide layer is reduced because of the resulting increase in the concentration of HCl. The reduction in the buffer layer growth rate increases out-diffusion of impurities from the substrate into the buffer layer with the previously mentioned undesirable reduction in resistivity of the buffer layer.

SUMMARY OF THE INVENTION

In accordance with the present invention, a method of growing a doped crystalline layer comprising a Group III-V material over a substrate includes the steps of providing a source of the dopant intermixed with a predetermined amount of the source of the Group III-V material at a first predetermined, independently controlled temperature, and directing a first flow of a reactive agent over the source of the dopant and Group III-V material to provide a doping vapor including components of said Group III-V material. A second source comprising the Group III-V material which is to be grown over the substrate is provided at a second, different predetermined temperature. A second flow of a reactive agent is directed over the source of the crystalline material to provide a resultant flow comprising components of said crystalline material. The first and second independent resultant flows provide a composite flow which is directed towards the substrate. Deposited from the composite flow is the crystalline layer including a predetermined controlled concentration of the dopant material. With such an arrangement, by providing a predetermined amount of the source of the crystalline material with the source of the dopant material while maintaining an independent source of crystalline material to grow the crystalline layer of the Group III-V material, the resultant first and second vapor flows which are directed towards the substrate will have higher concentrations of the components of the crystalline material. Since the concentrations of the components of the crystalline material are increased in the vapor stream, the reaction will proceed in the direction which deposits crystalline material over the substrate, rather than, in the direction which etches crystalline material from the substrate. Therefore, the growth rates for the material over the substrate will be increased. The increased growth rates will reduce fabrication costs. Further, with this arrangement, by providing independent control of the temperature of the dopant material and crystalline material source and the flow rate of the etching agent over the said source from the second source of crystalline material, the layer of crystalline material is grown having a dopant concentration which is controlled by manipulation of one of the predetermined temperatures. Preferably, the temperature at which the dopant source is etched is changed to control the concentration of the dopant in the crystalline layer, without changing the temperature at which crystalline growth occurs. Accordingly, the concentration of dopant can be modulated without changing the growth rate of the crystalline layer. Further, transition from growth of the crystalline layer doped with the aforementioned dopant to an undoped crystalline layer or a crystalline layer doped with a different dopant is made easier than prior techniques, since the first vapor stream comprising the dopant and Group III-V material is controlled independently from the second vapor stream comprising the Group III-V material. Hence, doping of the Group III-V material may be halted by stopping the flow of the dopant without halting the growth of the Group III-V layer.

In accordance with a further aspect of the present invention, a method of growing a doped crystalline layer comprising a Group III-V material includes the steps of providing a source of the dopant material intermixed with a predetermined amount of the source of the Group III-V material at a first predetermined temperature and directing a first flow of a reactive agent comprising a chloride of the Group V material over the intermixed source of dopant and Group III-V material to provide a dopant vapor. Preferably, the Group III-V material is selected from the group consisting of indium phosphide, aluminum phosphide, gallium phosphide, gallium antimonide, gallium arsenide and aluminum antimonide. The dopant is a suitable dopant for the selected Group III-V material selected from the group consisting of silicon, iron, copper, zinc, chromium and aluminum. The dopant vapor stream includes a precursor of the dopant, a precursor of the Group III material and the Group V material. This dopant vapor stream is intermixed within the reactor vessel with a growth vapor stream comprising the precursor of the Group III material and the Group V material which is produced in the reactor vessel. With such an arrangement, when the dopant precursor decomposes providing the dopant and a reactive agent including the chloride ion, the increased concentration of the Group III material which likewise decomposes when forming the Group III-V material will prevent the reactive agent from slowing the rate of the reaction which produces the Group III-V material.

In accordance with a further aspect of the present invention, a method of growing a doped epitaxial layer of gallium arsenide includes the steps of directing a flow of arsenic trichloride vapor over an intermixed source of the dopant and gallium arsenide disposed at a first predetermined temperature. A resulting first vapor flow comprising gallium chloride, arsenic, and a precursor of the dopant is provided. A source of gallium arsenide is provided at a second, different predetermined temperature. A second flow of arsenic trichloride vapor is directed over the source of gallium arsenide to provide a resultant vapor flow comprising gallium chloride and arsenic. The flows of gallium chloride and arsenic and of gallium chloride, arsenic and the dopant precursor are then directed towards the substrate. The epitaxial crystalline layer of gallium arsenide including a predetermined controlled concentration of the dopant are deposited from these vapor flows. The dopant is selected from the group consisting of chromium, iron, copper, aluminum and silicon. With this arrangement, the temperature of the source of dopant and, hence, the concentration of dopant is controlled independent from the temperature of the source of the gallium arsenide. Further, by providing a predetermined amount of gallium arsenide with the source of the dopant, the concentration of gallium chloride and arsenic in the vapor stream which is directed towards the substrate is increased. With the increased concentration of gallium chloride, the rate of the reaction which deposits gallium arsenide will be increased over prior techniques which provide an excess concentration of HCl. Thus, the reaction will be a net growth reaction rather than an etching reaction as often occurs with prior techniques.

When the dopant selected is chromium to grow compensated high resistivity GaAs buffer layers, the increased concentration of gallium chloride in the composite vapor stream increases the rate at which GaAs is provided. The gallium arsenide buffer layer can be grown sufficiently fast to prevent out-diffusion of so-called "fast diffusing impurities" such as iron and copper from the surface of the substrate. This provides better control of the electrical properties of the buffer layer. Further, by providing completely separate control of the dopant flow from the growth flow, the compensated buffer layer can be grown to an arbitrary thickness sufficient to isolate active regions of semiconductors from the crystal defects in the substrate.

In accordance with a further aspect of the present invention, a method of growing a chromium doped compensated buffer layer of gallium arsenide having a resistivity of at least $10^7$ ohm-cm includes the steps of directing a flow of arsenic trichloride over elemental chromium which is disposed at a first predetermined temperature in the range of 800° C. to 850° C. to provide a dopant vapor flow. A source of gallium arsenide is provided at a second predetermined temperature generally in the range of 760° C. to 820° C. A second independent flow of arsenic trichloride is directed over the gallium arsenide to provide a growth vapor flow comprising gallium chloride and arsenic. The dopant vapor flow and growth vapor flows are each directed towards a substrate held at a temperature typically 60° C. cooler than the temperature of the gallium arsenide source. With this arrangement, the concentration of the dopant flow is controlled independently from that of the growth vapor flow allowing for independent control of the dopant concentration. Further, by using arsenic trichloride to provide the dopant flow, increased reactivity with the chromium source is provided.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
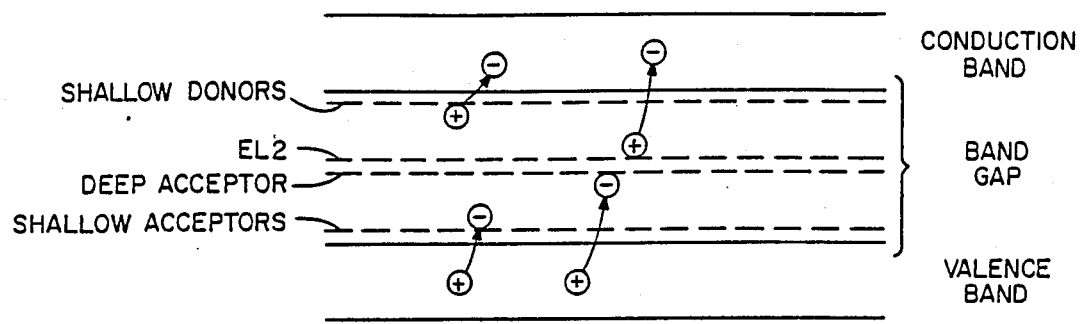
FIG. 1 is a diagrammatical representation of a theoretical band energy diagram of a GaAs crystal having electron energy levels resultin from stoichiometric efects in the crstal and electron energy levels resulting from dopants introduced into the crystal.
Figure 3:
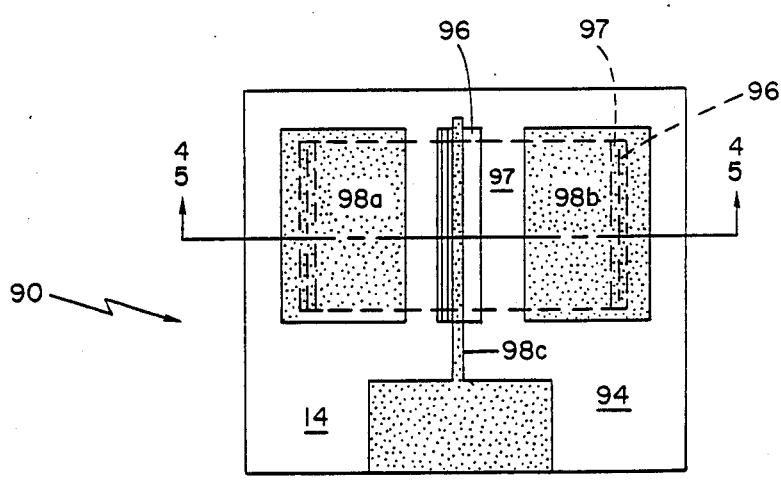
FIG. 3 is a plan view of a typical field effect transistor.
Figure 2:
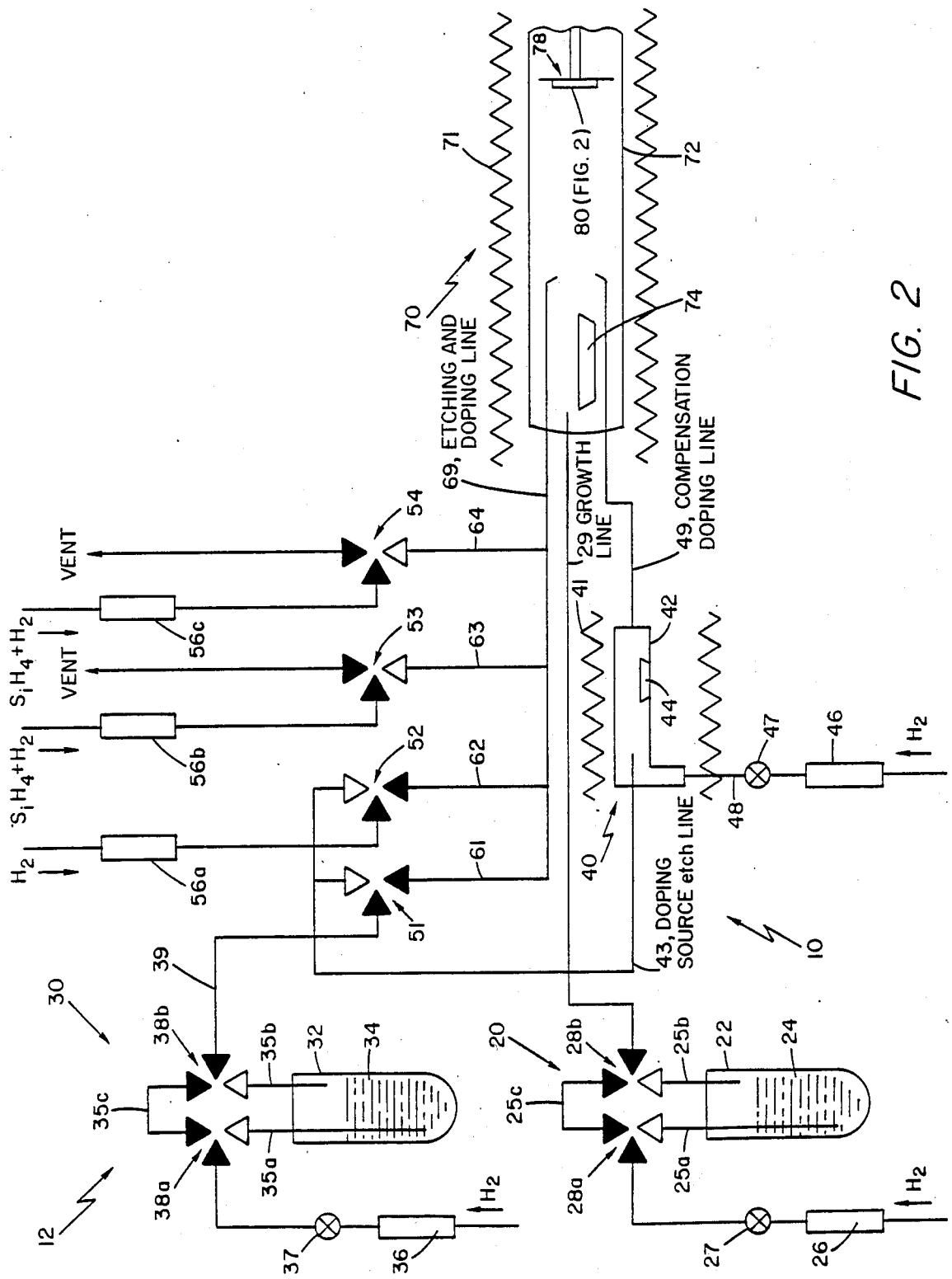
FIG. 2 is a schematic representation of an apparatus used to grow doped layers in accordance with the present invention.
Figure 4:
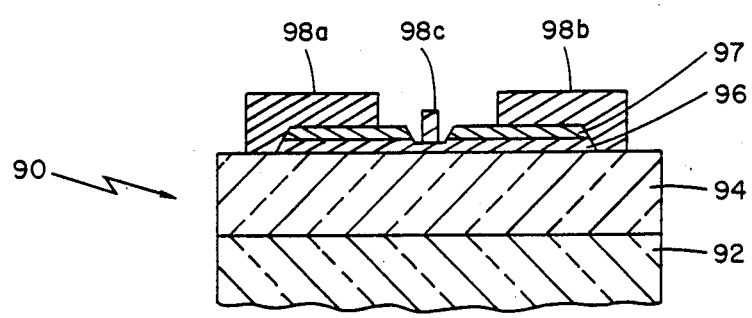
FIG. 4 is a cross-sectional view taken along line 4—4 of FIG. 3 showing the various layers used to fabricate the field effect transistor.
Figure 5:
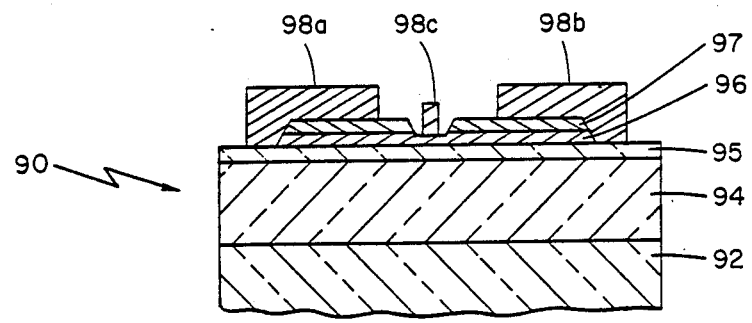
FIG. 5 is a cross-sectional view taken along line 5—5 of FIG. 3 showing an alternate embodiment of a field effect transistor.

Referring now to FIG. 2, a schematic representation of an opened tube vapor phase epitaxial apparatus 10 used to provide a compensated doped buffer layer 94 of a Group III-V material for a field effect transistor 90, as will be described in conjunction with FIGS. 3-5 is shown to include a vapor apparatus 12 and reactor apparatus 70. The vapor apparatus 12 is shown to include bubbler apparatus 20 and 30, and an independent retort system 40 having disposed therein a boat 44 containing a dopant source intermixed with a solid source of the material to be epitaxially grown. Suffice it to say that vapor apparatus 12 provides a "growth line" 29, "compensation doping line" 49 and "etching and doping line" 69 into a quartz or fused silica reaction tube 72 of reactor apparatus 70. Disposed in the reaction tube 72 is a fused silica boat 74, here containing a source, more preferably, a solid source of the epitaxial material to be grown. Here said boat 74 contains a solid source of gallium arsenide.

Tube 29 "the growth line" is fed from a solenoid actuated flow control valve 28b. Shaded ports (not numbered) of all solenoid valves show normally deactivated gas flow. In the normally deactivated state of solenoid control valve 28b and a solenoid control valve 28a, hydrogen gas is passed from a hydrogen source (not shown), via a flow regulator 26 and valve 27, to solenoid control valve 28a and to solenoid control valve 28b via tube 25c. The hydrogen gas, therefore, emerges from valve 28b and is fed to tube 29 the "growth line", to purge the furnace tube 72 of atmospheric gases. During growth of the gallium arsenide over the substrate 92, valves 28a and 28b are placed in their activated state enabling hydrogen gas to pass through tube 25a into a bubbler 22 which contains liquid arsenic trichloride 24 (AsCl3). The liquid arsenic trichloride 24 (AsCl3) within bubbler 22 is maintained at a constant temperature typically in the range of 0°-20° C., for example, by a constantly circulating coolant fluid (not shown) circulated into cooling jackets (not shown) which surround bubbler 22. The hydrogen gas is bubbled through the arsenic trichloride 24 and picks up molecules of arsenic trichloride. A mixture of hydrogen gas and arsenic trichloride emerges from bubbler 22, via tube 25b, and is fed to solenoid control valve 28b. Emerging therefrom via tube 29 is the mixture of hydrogen and arsenic trichloride. Tube 29 feeds the vapor flow of hydrogen and arsenic trichloride to reaction tube 72 upstream from the boat 74 of gallium arsenide.

Tube 69 "the etching line" is fed from a plurality of here four lines 61-64 which are, in turn, fed from solenoid control valves 51-54, respectively. Solenoid control valve 51 is fed from the etching bubbler apparatus 30 which provides a flow to etch substrate 92 during a substrate etching mode of operation and a flow to etch the dopant source 44 in retort system 40 in a compensating doping mode of operation. Solenoid valve 52 is fed from a hydrogen source which in the Cr doping mode provides a hydrogen carrier gas for the etching line 69 and in the etching mode provides hydrogen gas for a doping source etching line 43 as to be described. Solenoid control valves 53 and 54 are used to provide sources of silane and hydrogen (SiH$_4$+H$_2$) for doping of active layers (FIGS. 3, 4) as will be described. Line 39 which feeds solenoid control valve 51 is fed from a solenoid actuated flow control valve 38$b$. In the normally deactivated state of solenoid control valve 38$b$ and a solenoid control valve 38$a$, hydrogen gas is passed via a hydrogen source (not shown) through a flow regulator 36 and valve 37 to solenoid control valve 38$a$ and to solenoid control valve 38$b$, via tube 35$c$. The hydrogen gas, therefore, emerges from valve 38$b$ and is fed through tube 39, valve 51 and tube 69 to purge the reactor tube 72 of atmospheric gases. During etching of the substrate 92 prior to epitaxial growth of the gallium arsenide over the substrate 92, valves 38$a$ and 38$b$ are placed in their activated state enabling hydrogen gas to pass through tube 35$a$ into a bubbler 32 which contains the liquid arsenic trichloride 34 (AsCl$_3$). The liquid arsenic trichloride AsCl$_3$ within bubbler 32 is maintained at a constant temperature in the range of 0°–20° C., for example, by a constantly circulating coolant fluid (not shown) circulated into cooling jackets (not shown) which surround bubbler 32. The hydrogen gas is bubbled through the arsenic trichloride and picks up molecules of arsenic trichloride. A mixture of hydrogen gas and arsenic trichloride emerges from bubbler 32, via tube 35$b$, and is fed to solenoid control valve 38$b$. Emerging therefrom, via tube 39, is the mixture of hydrogen and arsenic trichloride. Tube 39 feeds deactivated solenoid control valve 51 and, hence, tubes 61 and 69 to provide the vapor flow of hydrogen and arsenic trichloride into reaction tube 72 downstream from the boat 74 containing the gallium arsenide.

Tube 49 "the doping line" is fed from a retort system 40. Retort system 40 includes a resistive-type retort heater 41 within which is disposed a retort tube 42 comprised of silica or fused quartz. Disposed within retort tube 42 is a fused silica boat 44 containing a source of doping material here said source comprises chromium, a source of the epitaxial material to be grown here and gallium arsenide crystals. The material with retort tube 42 is at an elevated temperature in the range of about 800° C. to 850° C., preferably, at about 820° C. initially. The temperature of the retort may however be adjusted during doping of the layer 94 (FIGS. 3–5) to control the concentration of dopant in said layer. The ratio by volume of chromium to gallium arsenide crystals is about 50%/50%. The actual ratio of GaAs to Cr is not critical. However, it is important to provide sources of these materials having large surface areas to insure that the reactions proceed efficiently. The only critical constraint on the ratio is that neither the dopant source nor the crystalline material source be allowed to be exhausted during growth of the Cr doped layers. The retort tube 42 is fed by a first line 48 which is fed hydrogen, via a flow regulator 46 and a valve 47. The retort tube 42 is fed, via a second line 43 "the doping source etch line", which is fed via solenoid valves 51 and 52. During growth of chromium doped buffer layers, the solenoid control valves 38$a$ and 38$b$ are activated enabling hydrogen gas to pass through regulator 36 to solenoid valve 38$a$ and into bubbler 32, via tube 35$a$. As previously described, the hydrogen bubbles through the liquid arsenic trichloride in bubbler 32 and emerges from bubbler 32, via line 35$b$, feeding solenoid control valve 38$b$. Emerging from solenoid control valve 38$b$, via line 39, is the mixed flow of hydrogen and arsenic trichloride. However, solenoid control valve 51 is activated enabling the mixed flow of hydrogen and arsenic trichloride to pass through solenoid control valve 51 to doping source etch line 43. Concomitantly, the solenoid control valve 52 is activated enabling a flow of hydrogen gas to flow through tube 69 thereby increasing the flow of hydrogen gas in the reactor tube 72. As previously mentioned, tube 43 delivers the arsenic trichloride and hydrogen vapor flow into retort 42. The arsenic trichloride and hydrogen are fed into the retort 42 and decomposed in accordance with reaction (1):

$$2AsCl_3 + 3H_2 \rightarrow 6HCl + \tfrac{1}{2}As_4 \qquad (1)$$

In retort 42, the reaction products (HCl and As$_4$) of reaction (1) react with the chromium and gallium arsenide provided in the boat 44 in retort tube 42 according to reactions (2A) and (3A):

$$Cr + 2HCl \rightarrow CrCl_2 + H_2 \qquad (2A)$$

$$GaAs + 2HCl \rightarrow GaCl_x + \tfrac{1}{4}As_4 + H_2 \qquad (3A)$$

where x is generally 1, 2, 3 and/or 4. Thus, a composite vapor stream comprising the dopant precursor CrCl$_2$, and GaAs components As$_4$ and GaCl$_x$, is transported into the reaction tube 72, emerging downstream from the gallium arsenide source 74.

The epitaxial reactor apparatus 70 is shown to further include a multiple zone furnace 71 within which is disposed the fused silica or quartz furnace tube 72. The substrate 92, here comprised of gallium arsenide or other suitable Group III-V semiconductor material or other suitable semiconductor material is disposed within the furnace tube 72 upon a support member 78. Here the support member 78 is also comprised of fused silica or quartz and is orientated perpendicularly to the center axis of the furnace tube 72, as shown. The substrate 92 is here a bulk gallium arsenide substrate upon which is to be sequentially epitaxially grown the semi-insulating buffer layer 94, an active layer 96, and a contact layer 97 of the field effect transistor 90 (FIGS. 3 and 4).

In operation, after the substrate 92 and the boat 74 comprising gallium arsenide are placed in the reaction tube 72, the reaction tube 72 is purged of atmospheric gases by introduction of hydrogen via lines 29, 49 and 69. The temperature within the multiple temperature zone furnace 71 is then raised to provide a predetermined desired temperature profile, with the substrate 92 being held at a temperature of 760° C. and the boat 74 containing the source of gallium arsenide being held at a temperature of 820° C., for example. Other temperature profiles for the substrate 92 and the boat 74 may alternatively be used to obtain a desired growth rate. Furthermore, two intermediate temperature zones are provided between the gallium arsenide source and boat 74 and the substrate 92 to provide an approximately linearly declining temperature between the source 74 and the substrate 92. The outwardly exposed surfaces of substrate 92 and the material in boat 74 are cleaned and etched away before growth of the sequential epitaxial layers 94, 96 and 97 (FIGS. 3 and 5) is initiated. When a stable temperature has been reached, valves 28$a$, 28$b$ and 38a, 38b are activated enabling a mixture of hydrogen and arsenic trichloride to emerge from tubes 29 and 39. Valve 51 is deactivated enabling the mixture of arsenic trichloride and hydrogen from tube 39 to emerge via tube 61 and to feed tube 69. Thus, mixtures of hydrogen and arsenic trichloride emerge from tubes 29 and 69. The gaseous hydrogen and arsenic trichloride in each flow are at a desired reaction temperature and will decompose into gaseous arsenic and gaseous hydrogen chloride in accordance with reaction 1:

$$3H_2 + 2AsCl_3 \longrightarrow \tfrac{1}{2} As_4 + 6HCl \quad (1)$$
$$\text{(gas)} \qquad\qquad \text{(gas)} \quad \text{(gas)}$$

The gaseous hydrogen chloride etches the surface of the substrate 92 and the surface of the gallium arsenide in boat 74 thereby freeing each from contaminants. After the surface of substrate 92 and the surface of the gallium arsenide in boat 74 have been etched and cleaned, the buffer layer 94 is epitaxially grown over substrate 92 as will now be described.

The buffer layer is grown over substrate 92 as follows. Valves 38a, 38b and 51, are placed in their activated state, thereby enabling a mixture of arsenic trichloride and hydrogen to emerge from tube 39 and to feed tube 43. Valves 28a and 28b are placed in their activated state enabling arsenic trichloride vapors to emerge via tube 29, "the growth line." As previously mentioned, the arsenic trichloride which emerges from tube 43 reacts in accordance with reaction 1:

$$2AsCl_3 + 3H_2 \rightarrow 6HCl + \tfrac{1}{2}As_4 \quad (1)$$

and provides gaseous HCl which reacts with the chromium and gallium arsenide in the retort source 44 in accordance with reactions (2A) and (3A) over the preferred temperature ranges specified:

$$Cr + 2HCl \xrightarrow{800°\ C. \leq T \leq 850°\ C.} CrCl_2 + H_2 \quad (2A)$$

$$GaAs + 2HCl \xrightarrow{800°\ C. \leq T \leq 850°\ C.} GaCl_x + \tfrac{1}{4} As_4 + H_2 \quad (3A)$$

where x is generally 1, 2, 3 and/or 4. Therefore, emerging from doping line 49 is a first flow comprising chromium chloride ($CrCl_2$), arsenic ($As_4$) and gallium chloride ($GaCl_x$).

Emerging from growth line 29 is arsenic trichloride ($AsCl_3$) and hydrogen ($H_2$) which react with the gallium arsenide (GaAs) in boat 74 in accordance with the following reactions:

$$AsCl_3 + H_2 \rightarrow HCl \tfrac{1}{2} As_4 \quad (1)$$

$$GaAs + 2HCl \rightarrow GaCl_x + H_2 + \tfrac{1}{4}As_4 \quad (3A)$$

The gaseous hydrogen chloride etches the surface of the solid gallium arsenide source in boat 74 producing a second flow comprising gaseous gallium chloride and gaseous arsenic.

The gaseous gallium chloride and arsenic vapors are transported towards the substrate 92. Similarly, the first flow comprising the gaseous gallium chloride, the gaseous arsenic and the gaseous chromium chloride emerge from tube 49 and mix with the aforementioned second flow. This mixed composite flow is transported towards the substrate 92 where it is cooled due to the temperature difference in the multiple zone furnace. As a result of this cooling, gallium arsenide having a predetermined controlled concentration of chromium is condensed out of the vapor stream in accordance with reactions (3B) and (4):

$$6H_2 + 4GaCl_x + As_4 \xrightarrow{T = 760°\ C.} 4GaAs + 12HCl \quad (3B)$$

$$3CrCl_2 \xrightarrow{T = 760°\ C.} Cr + 2CrCl_3 \quad (4)$$

The chromium is introduced into the epitaxially grown gallium arsenide layer in a controlled manner, since the concentration of $CrCl_2$ is controlled independently of the concentration of the $GaCl_x$ and $As_4$ provided from the GaAs source 74. Thus, the Cr doping may be stopped relatively easily compared to prior techniques. Further, the temperature of the retort may be manipulated preferably within the range of 800° C. to 850° C. to control the concentration and indeed modulate the concentration of Cr in the crystalline GaAs layer without changing the growth temperature of the GaAs crystalline layer or the GaAs source 74 and hence the rate of growth of the GaAs crystalline layers.

Referring now also to FIGS. 3 and 4, after growth of the doped buffer layer 94, the surface of buffer layer 94 may be cleaned and etched in preparation for growth of active and contact layers 96 and 97 (FIG. 3). Solenoid control valve 51 is deactivated valve 52 activated and retort heater 41 is cooled down thus inhibiting the flow of chromium vapors through line 49. With valve 51 deactivated, hydrogen which is bubbled through the liquid arsenic trichloride in bubbler 32 is fed to tube 69 to etch the surface of the buffer layer 94 in accordance with reaction (5) as described above. After the surface of the buffer layer 94 is cleaned and etched, valves 38a and 38b are placed in their deactivated state providing an $H_2$ flow through tube 69 and valves 28a and 28b are activated again enabling a flow of arsenic trichloride through growth line 29. Concomitantly therewith, valve 53 is placed in its activated state enabling a first predetermined flow of silane and hydrogen ($SiH_4 + H_2$) to flow through flow controller 56b to etching and doping line 69, via line 63. Here the exposed, previously etched and cleaned surface of buffer layer 94 acts as a nucleation site for vapors of gallium arsenide produced from etching the gallium arsenide in boat 74 in a similar manner as previously described. Thus, as the gallium arsenide is epitaxially grown on the surface of the buffer layer, an n-type dopant material, here silicon provided by the silane gas, is controllably introduced as a dopant material for growing the gallium arsenide n doped active region, as is known in the art.

After active layer 96 is grown to a predetermined thickness, the active layer 96 surface is again etched in accordance with reaction (5) and the contact layer 97 is grown. The contact layer 97 is here a conventional n+type contact layer and is grown in a similar manner as described above for n-type active layer 96 except that the concentration of silane gas introduced is increased to here 100 parts per million and is introduced from line 64 onto line 69 via the flow regulator 56c and solenoid control valve 54.

Figure 6:
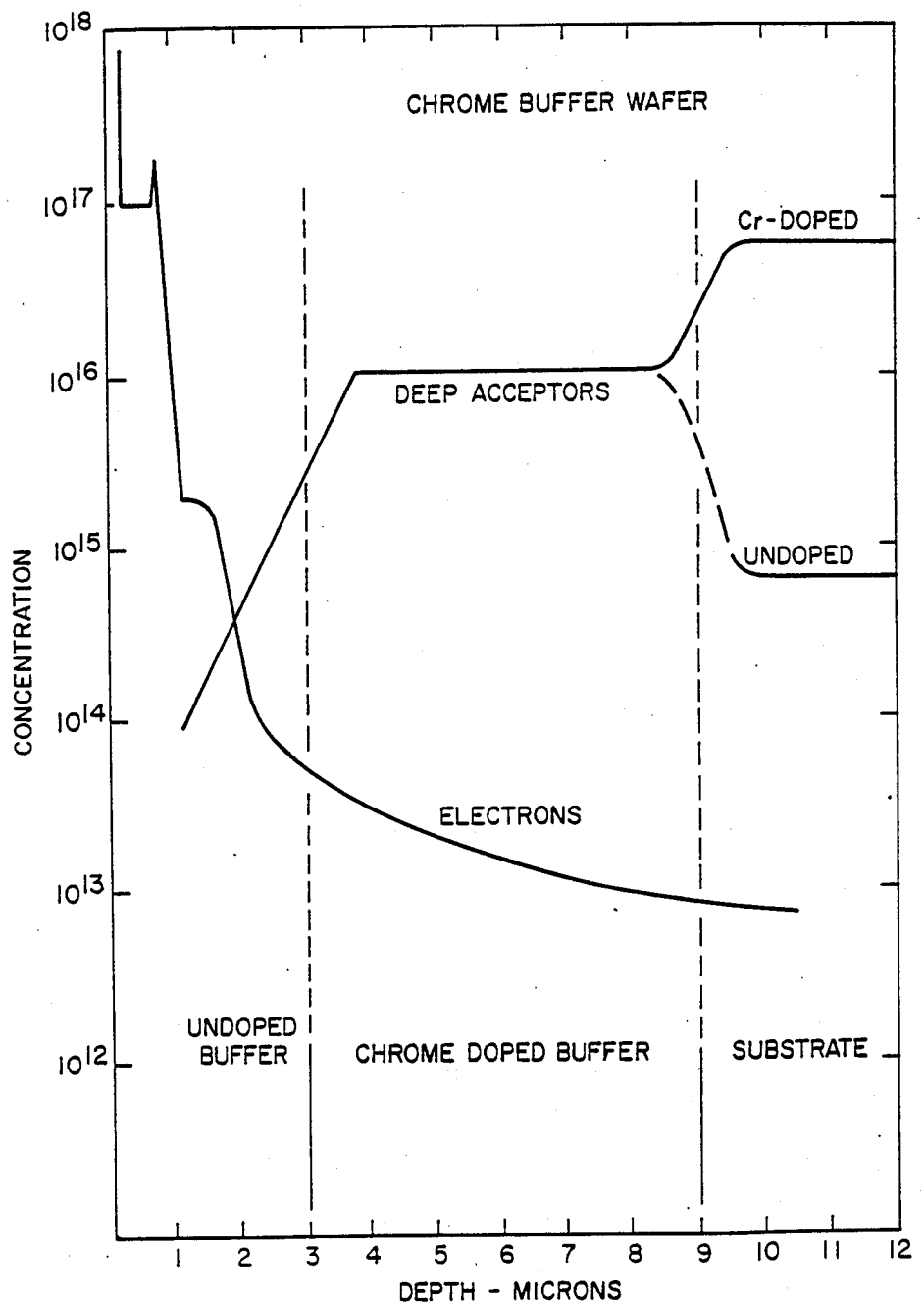
FIG. 6 is a diagrammatical plot of a preferred doping density profile for a field effect transistor.

Alternatively, as shown in FIG. 5, since the chromium dopant concentration is readily controlled, the buffer layer and active layers can be grown without any disruption during the growth process. After growth of buffer layer 94, solenoid control valves 51 can be deactivated 52 activated and retort heater 41 cooled down to inhibit vapor flow from retort 42. However, valves 38a, 38b are deactivated enabling a flow of $H_2$ to be fed through valve 51 into line 69. Growth of GaAs continues uninterrupted. As described in a copending application of B. Van Rees and B. Liles and assigned to the same assignee as the present invention, a second buffer layer 95 having a Cr concentration which monotonically decreases as a function of thickness from about $5 \times 10^{15}$ atoms/cc to less than about $10^{14}$ atoms/cc is grown to a thickness of 1–2 microns over buffer layer 94. Any residual Cr dopant present in the reactor tube 72 will be incorporated in the buffer layer 95 as the flow of dopant vapor from tube 49 (FIG. 2) is gradually reduced by either reducing the temperature in retort 40 (FIG. 2) or the flow rate through line 43 (FIG. 2). The active layer 96 is then grown over buffer layer 95. Buffer layer 95 having a resistivity of about $10^5$ ohm-cm is substantially deplete of the deep level acceptor chromium compared to the concentration of Cr in buffer layer 94. Buffer layer 95 shields active layer 96 from the electric field associated with the ionization of the deep acceptor chromium in heavy doped buffer layer 94 as often occurs in the presence of a large electron current flux. Buffer layers 94 and 95 will have a typical doping profile as shown in FIG. 6.

The above described arrangement provides two important advantages for growing layers of Group III-V materials having chromium as a dopant. First, by providing the chromium in a separate retort system 40, the temperature of the chromium and the reaction rate of the chromium in the retort system is independently controllable from the growth rates within the reaction tube 72. This enables the concentration of chromium in the doping vapor stream to be selectively controlled and indeed to be cut-off after a predetermined doping profile has been provided. This acts in preventing chromium from diffusing into subsequently epitaxially grown active layers. By feeding $AsCl_3$ from the existing etching and doping bubbler 30, a strong reactive agent ($AsCl_3$) is directed over the Cr source. Further, growth of active layers 96, 98 can occur immediately after buffer layer growth by stopping the $AsCl_3$ vapor flow into retort 40. This flip-flop bubbler design thus allows the same bubbler to be used for different operations, i.e., "etching" and "Cr doping", as well as, permits easier control of $AsCl_3$ to stop etching of Cr source and hence Cr doping. Furthermore, by placing gallium arsenide into the chromium source, the presence of the gallium arsenide permits maintenance of high growth rates of Cr doped gallium arsenide epitaxial layers. With prior techniques, one consequence of elemental etching of Cr was production of excess concentration HCl ([HCl]). The excess [HCl] reduces the growth rate of the gallium arsenide epitaxial layers. At a particular temperature, reaction (3B) is in equilibrium and proceeds towards the right to produce GaAs. However, by increasing the [HCl] a new equilibrium must be established which reduces the drive of reaction (3B) towards the right.

$$GaAs + 2HCl \rightarrow GaCl_x + \tfrac{1}{4}As_4 + H_2 \tag{3A}$$

$$GaCl_x + \tfrac{1}{4}As_4 + H_2 \rightarrow GaAs + 2HCl \tag{3B}$$

Thus, if the concentration of HCl is increased, the rate at which reaction (3B) will be driven towards the right will be reduced. With a sufficient increase in the [HCl], reaction (3B) will reverse and be driven towards the left to produce the products $GaCl_x$, $\tfrac{1}{4}As_4$ and $H_2$. Thus, etching as in reaction (3A) of GaAs rather than growth as reaction (3B) of GaAs will occur.

Accordingly, by providing flows comprising $GaCl_x$, $\tfrac{1}{4}As_4$ and $CrCl_2$ from the reactions (2A, 3A) in the retort tube 42:

$$Cr + 2HCl \rightarrow CRCl_2H_2 \tag{2A}$$

$$GaAs + 2HCl \rightarrow GaCl_2 + \tfrac{1}{4}As_4 + H_2 \tag{3A}$$

an increase in the concentration of the Group III material here Ga is provided. The increased concentration of As and Ga in the composite vapor stream directed towards the substrate 92 compensates for the increased concentration of HCl. Hence, the tendency for reaction (3A) to proceed thereby etching substrate 92, as in prior techniques, will be reversed and thus at the substrate reaction (3B) will occur despite the increased [HCl]. Thus, with this arrangement, controlled doping of Cr is provided while a relatively high growth rate of GaAs over the substrate 92 is maintained.

Referring now to FIGS. 3–5, a field effect transistor 90 is shown to include a substrate 92, here comprising gallium arsenide having a plurality of sequentially vapor phase epitaxially deposited layers 94, 95 (FIG. 5) 96, 97 of gallium arsenide formed over a first surface thereof, and drain 98a, source 98b and gate 98c electrodes. As shown in FIG. 4, buffer layer 94, here is a chromium doped, high resistivity buffer layer fabricated in accordance with the method herein before described. Buffer layer 94 has a resistivity of about $10^7$ ohm-cm and a substantially constant concentration of Cr dopant of about $10^{16}$ atoms/cc. The buffer layer 94 is here grown to a thickness of at least 6 microns, preferably greater than 6 microns. Buffer layer 94 having a high resistivity, substantial perfect crystalline structure and being a relatively thick layer sufficiently isolates the remaining epitaxial layers of the field effect transistor 90 from the crystalline imperfections and impurities of the gallium arsenide substrate 92. After buffer layer 94 is grown to a predetermined thickness, the solenoid control valves 38a, 38b are placed in their deactivated state inhibiting arsenic trichloride from emerging from tube 43 and active layer means including active layer 96, contact layer 97 and drain 98a, source 98b and gate 98c electrodes are provided.

Alternatively, a second buffer layer, as shown in FIG. 5, may be grown over buffer layer 94. The concentration of chromium which is deposited in the buffer layer 95 substantially declines in a monotonic manner from about the concentration in buffer layer 94 to a concentration of less than about $10^{14}$ atoms/cc. Buffer layer 95 is provided with a thickness of generally 1 to 2 microns such that the upper surface of buffer layer 95 is substantially depleted of chromium having a concentration of less than about $10^{14}$ atoms/cc. Active layer 96 and contact layer 97, as well as, electrodes 98a, 98b, 98c are then provided in a conventional manner over intermediate buffer layer region 95.

With this arrangement, the buffer layer 94 may be fabricated with faster growth rates than typical devices, and buffer layer 94 is grown sufficiently fast to out-run the diffusion of impurities such as copper and iron from the substrate. Also, a region, buffer layer 95, substantially free of deep acceptors and impurities is provided upon which the active region 96 and the contact region 97 may be grown. The thin relatively uncompensated buffer layer 95 acts as a diffusion shield for the relatively slow diffusion chromium dopant in the substrate 92 and buffer layer 94 thereby preventing chromium from diffusing into the active regions of the field effect transistor. Further, by providing the intermediate buffer layer 95 having a relatively low concentration of a deep level acceptor such as chromium, the deep level acceptor ionization and low rate of recombination problems are substantially reduced.

Although this invention disclosure has been described in terms of growing gallium arsenide chromium doped layers by directing arsenic trichloride vapor over an intermixed source of gallium arsenide and chromium, it should be understood that other dopants suitable for use in doping gallium arsenide may alternatively be used for different purposes. For example, silicon, iron, copper, zinc and aluminum may be substituted for the chromium in the intermixed source of the dopant and gallium arsenide and arsenic trichloride may then be directed over the intermixed source of the dopant and the gallium arsenide providing a vapor stream comprising precursor components of the dopant and precursor components of the gallium arsenide. Furthermore, in other Group III-V material systems employing a precursor chloride component of the Group V material, for example, nitrogen trichloride, phosphorous trichloride or phosphorous pentachloride, arsenic pentachloride, antimonium trichloride or antimonium pentachloride, the Group III-V material may be intermixed with a suitable dopant for said Group III-V material and the reactive trichloride or pentachloride may be directed over that intermixed source of dopant in the Group III-V material. A vapor stream is provided comprising the dopant precursor and the precursor components of the selected Group III-V material. The Group III-V material may include materials such as indium phosphide, aluminum phosphide, gallium phosphide, gallium antimonide, and aluminum antimonide.

Having described preferred embodiments of the present invention, it will now be apparent to one of skill in the art that other embodiments incorporating this concept may not be used. It is felt, therefore, that this invention should not be limited to the disclosed embodiments, but rather should be limited only by the spirit and scope of the appended claims.

What is claimed is:

1. A method of growing a doped crystalline material over a substrate comprising the steps of:
    directing a first flow of a reactive agent over a source of the dopant intermixed with a first source of said crystalline material at a first predetermined temperature to provide a dopant vapor flow comprising dopant vapor and components of said crystalline material;
    directing a second flow of a reactive agent over a second source of the crystalline material to provide a growth vapor flow comprising components of said material, with said crystalline material disposed at a second, predetermined temperature;
    directing said dopant vapor and growth vapor towards the substrate; and
    depositing from said vapor flows the doped crystalline layer.

2. The method of claim 1 wherein said dopant is selected from the group consisting of silicon, iron, copper, zinc and chromium and said crystalline material is a Group III-V material.

3. The method of claim 2 wherein said Group III-V material is gallium arsenide.

4. A method of growing a doped layer of a Group III-V material over a substrate comprises the steps of:
    directing a first flow of a reactive agent over a first intermixed source of the Group III-V material and the dopant, disposed at a first predetermined temperature, to provide a dopant vapor flow comprising components of said Group III-V material;
    directing a second flow of a reactive agent over a second source of the Group III-V material at a second, different predetermined temperature to provide a growth vapor flow comprising components of said Group III-V material with the temperature of said dopant and Group III-V material source being independently controllable from the temperature of the second source of Group III-V material; and
    depositing the Group III-V material and the dopant from the directed vapor flows to provide the doped layer of Group III-V material.

5. The method of claim 4 wherein said dopant is selected from the group consisting of silicon, iron, copper, zinc and chromium and said crystalline material is a Group III-V material.

6. The method of claim 4 where said dopant is chromium.

7. The method of claim 6 wherein said Group III-V material is gallium arsenide.

8. A method of growing a doped layer of gallium arsenide over a substrate comprises the steps of:
    directing a first flow of arsenic trichloride vapor over a source of gallium arsenide and the dopant disposed at a first predetermined temperature to provide a dopant, vapor flow comprising gallium chloride, arsenic and a precursor of the dopant;
    directing a second flow of arsenic trichloride vapor over a second source of gallium arsenide disposed at a second predetermined temperature to provide a growth vapor flow comprising gallium chloride and arsenic; and
    depositing gallium arsenide and the dopant from the directed vapor flows to provide the doped layer of gallium arsenide.

9. The method of claim 8 wherein the temperature of the gallium arsenide and dopant source is independently controllable from the temperature of the gallium arsenide source.

10. The method of claim 9 wherein said dopant is selected from the group consisting of silicon, iron, copper, zinc and chromium and said crystalline material is a Group III-V material.

11. The method of claim 10 wherein said dopant is chromium.

12. The method of claim 9 wherein the source of gallium arsenide and source of the dopant is disposed at a temperature in the range of 800° C. to 850° C.

* * * * *

UNITED STATES PATENT AND TRADEMARK OFFICE
CERTIFICATE OF CORRECTION

PATENT NO. : 4,689,094

DATED : Aug. 25, 1987

INVENTOR(S) : Van Rees et al.

It is certified that error appears in the above-identified patent and that said Letters Patent is hereby corrected as shown below:

Column 7, line 63, delete "resultin" and replace with --resulting--.

Column 7, line 64, delete "efects" and replace with --defects--.

Column 7, line 64, delete "crstal" and replace with --crystal--.

Column 11, line 53, delete "$AsCl_3 + H_2 \rightarrow HCl\frac{1}{2}As_4$" and replace with --$AsCl_3 + H_2 \rightarrow HCl + 1/2\ As_4$--.

Signed and Sealed this

Twenty-third Day of May, 1989

*Attest:*

DONALD J. QUIGG

*Attesting Officer*   Commissioner of Patents and Trademarks